United States Patent
Yoshida

(10) Patent No.: US 7,102,373 B2
(45) Date of Patent: Sep. 5, 2006

(54) INSPECTION UNIT

(75) Inventor: Takuto Yoshida, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 0 days.

(21) Appl. No.: 11/238,046

(22) Filed: Sep. 29, 2005

(65) Prior Publication Data

US 2006/0066330 A1      Mar. 30, 2006

(30) Foreign Application Priority Data

Sep. 30, 2004      (JP) .......................... P2004-288230

(51) Int. Cl.
*G01R 31/02* (2006.01)
(52) U.S. Cl. .................. 324/755; 324/761; 324/754; 324/158.1
(58) Field of Classification Search .............. None
See application file for complete search history.

(56) References Cited

FOREIGN PATENT DOCUMENTS

JP      2001-099889 A      4/2001

*Primary Examiner*—Jermele Hollington
*Assistant Examiner*—Jimmy Nguyen
(74) *Attorney, Agent, or Firm*—Morgan, Lewis & Bockius LLP

(57) ABSTRACT

A conductive member has a first face adapted to be mounted on a board on which an inspection circuit is arranged and a second face adapted to be opposed to a device to be inspected. The conductive member is formed with a plurality of first through holes having a first common diameter and communicating the first face with the second face. A first contact probe is provided with a first tubular body having a second diameter which is smaller than the first diameter, and a first plunger retractably projected from one end of the first tubular body. A second contact probe is provided with a second tubular body having a third diameter which is smaller than the second diameter, and a second plunger retractably projected from one end of the second tubular body. A retainer is formed with a plurality of second through holes having a common shape, and provided on at least the second face of the conductive member so as to communicate the first through holes with the second through holes, so that the first contact probe and the second contact probe are retained in the conductive member while only the first plunger and the second plunger are projected from one ends of the second through holes.

8 Claims, 3 Drawing Sheets

INSPECTION UNIT

BACKGROUND OF THE INVENTION

The present invention relates to an inspection unit for a high frequency/high-speed device for ensuring reliable connection between the inspection unit and the device to be inspected, on occasion of inspecting its electrical performance, before a module of a high frequency/high-speed circuit such as an amplifier circuit, a mixer circuit, a filter circuit, a memory, a CPU, etc. or an IC to be incorporated in a mobile phone, for example, has been assembled to a circuit board. In this specification, the term "high frequency" refers to an analogue signal having a high frequency (1 GHz or more), while the term "high-speed" refers to a digital signal having very short pulse width and pulse interval, and both of which are hereinafter collectively referred to as RF (radio frequency).

On occasion of inspecting electrical performance of the RF device such as a semi-conductor wafer, an IC, or a module, insufficient contacts between the terminals may particularly cause fluctuation of impedance or other measurement factors, which may sometimes vary to change measured values. Under the circumstances, such inspection has been conducted by means of a special inspection unit, for example, as shown in FIG. 4A (disclosed in Japanese Patent Publication No. 2001-99889A). In such an inspection, an RF circuit, which is the device to be inspected, is constructed in a form of a module 50 including an amplifier circuit and a mixer circuit, and is housed in a metal casing for avoiding interference with the exterior. The module 50 includes input and output terminals 51, 54 for RF signals, a power supply electrode terminal 52, and a grounding terminal 53, which are provided on a back face of the metal casing. Then, the inspection is conducted by electrically connecting the terminals to respective terminals of a wiring board 66 on which certain wirings for the inspection are arranged.

In the example as shown in FIG. 4A, there are employed contact probes each having a spring and a plunger contained in a metal pipe, one end of the plunger being adapted to be projected to the exterior by the spring and contracted when pushed. The respective electrode terminals are connected by contact probes 63 for RF signals, a contact probe 64 for power supply, and a contact probe 65 for grounding which are contained in a metal block 61 for preventing them from being affected by noises. Each of the contact probes 63 for RF signals is formed in a coaxial structure, using the contact probe as a core conductor and using an inner wall of a through hole in the metal block 61 as an outer conductor, especially for preventing intrusion of noises. In FIG. 4A, denoted with numeral 67 is a coaxial cable, and 68 is a plate for pressing the metal pipes surrounding the contact probes. Such a structure around the contact probes is almost the same in case of an IC socket for inspecting ICs, though such a socket has a different outer shape.

Although FIG. 4A shows only two contact probes 63 for RF signals (for input and output), contact probes 64, 65 each for power supply and for grounding, a large number of these contact probes are actually provided. In the maximum case, the electrode terminals of about 600 pieces per 1 cm$^2$ are provided in a matrix manner with a narrow pitch of about 0.4 mm. Under the circumstances, each of the contact probes has to be extremely small in diameter. Particularly, the contact probe 63 for RF signals has become very small, because it is required to serve as the core conductor of the coaxial structure under certain dimensional relationship with an inner diameter of the through hole which is formed in the metal block 61 as the outer conductor. On the other hand, it is desirable that the contact probe 64 for power supply and the contact probe 65 for grounding are as thick as possible, for the purpose of reducing resistance loss. For this reason, the outer diameters of the contact probes and the inner diameters of the through holes are different depending on the respective contact probes, as shown in FIG. 4B.

Specifically, in a case of constructing an inspection unit in which an interval between the contact probes is 0.5 mm, the contact probes have various values in diameter. For example, the outer diameter d1 of the contact probe 63 for RF signals is 0.2 mm and the inner diameter D1 of the through hole is 0.45 mm, whereas the outer diameter d2 of the contact probe 64 for power supply is 0.3 mm and the inner diameter D2 of the through hole is 0.42 mm, and the outer diameter d3 of the contact probe 65 for grounding is 0.3 mm and the inner diameter D3 of the through hole is 0.4 mm. On the other hand, all the contact probes have the same length L which is set to be 4.0 mm, for example.

As described above, the contact probes and the through holes of the metal block in which the contact probes are disposed have different diameters for usage of respective contact probes, and therefore the conventional inspection unit is constructed in such a manner that the contact probes are disposed in respective positions according to the arrangement of the electrode terminals in a device to be inspected. Meanwhile, such inspection unit is unable to be prepared prior to developing stage, because in the developing stage of the module and IC of this type, various adjustments are continued along with the inspection, and accordingly, there may be changes in the arrangement of the electrode terminals, such as addition of a grounding terminal.

Nevertheless, even in the developing stage, it is impossible to perform accurate inspection unless a reliable inspection unit is employed. Under the circumstances, there is a problem that in a case where various inspection units are prepared in the developing stage, it would lead to an enormous increase of cost. Furthermore, in a case where provisional inspecting tools are used in order to conduct the inspection in the developing stage, and a producer of inspection units starts to produce a definitive version of the inspection unit after completion of the development based on the fixed arrangement of the electrode terminals in the device to be inspected, these may be a problem that it would not be in time for conducting the inspection immediately. Especially in a case where the producer of the inspection unit is different from the developer of the device, the developer of the device generally have a tendency not to disclose the arrangement of the electrode terminals to the producer of the inspection unit to the final stage of the development, in some cases, which is a serious time factor in preparing the inspection unit.

SUMMARY OF THE INVENTION

It is an object of the invention to provide an inspection unit which can be easily manufactured, even in a stage of developing a module or IC, and can be supplied in a short time so that a new device can be inspected immediately after the device has been developed.

It is also an object to provide an inspection unit having a structure which can reliably conduct the inspection with no need of producing particular inspection units on every occasion, according to arrangement of pins (arrangement of electrode terminals) in the device to be inspected, even in a case of developing stage where the arrangement of the pins has not yet formally determined, or in a case where the inspection is conducted to devices with small number and many types where a wide variety of the pin arrangements exist.

In order to achieve the above objects, according to the invention, there is provided an inspection unit, comprising:

a conductive member, having a first face adapted to be mounted on a board on which an inspection circuit is arranged and a second face adapted to be opposed to a device to be inspected, the conductive member being formed with a plurality of first through holes having a first common diameter and communicating the first face with the second face;

a first contact probe, comprising a first tubular body having a second diameter which is smaller than the fist diameter, and a first plunger retractably projected from one end of the first tubular body;

a second contact probe, comprising a second tubular body having a third diameter which is smaller than the second diameter, and a second plunger retractably projected from one end of the second tubular body; and a retainer, formed with a plurality of second through holes having a common shape, and provided on at least the second face of the conductive member so as to communicate the first through holes with the second through holes, so that the first contact probe and the second contact probe are retained in the conducive member while only the first plunger and the second plunger are projected from one ends of the second through holes.

The first contact probe may be adapted to transmit a non-RF signal and the second contact probe may be adapted to transmit an RF signal. Herein, the RF signal includes both an analogue high frequency signal, and a digital short pulse signal having a short pulse interval, in which repetitions of sine waves or pulses are at 1 GHz or more. The non-RF signal includes a signal having lower frequency (including DC signals) or longer pulse interval, a grounding signal and so on.

Each of the second through holes may have a first part having a fourth diameter which is smaller than the second diameter and larger than the third diameter, and have a second part having a fifth diameter which is smaller than the third diameter and larger than a diameter of each of the first plunger and the second plunger.

Here, the retainer may comprise an insulative plate member formed with the second through holes.

Alternatively, the retainer may comprise a conductive plate member having a third through holes having a common shape and insulative spacers each of which is formed with one of the second through holes and fitted into one of the third through holes.

Further, an inner diameter of each of the second through hole may be varied stepwise so as to have at least the fourth diameter and the fifth diameter.

Alternatively, the inner diameter of each of the second through hole may be varied continuously so as to have at least the fourth diameter and the fifth diameter.

Further, the second tubular body may be longer than the first tubular body.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE EMBODIMENTS

Figure 1A:
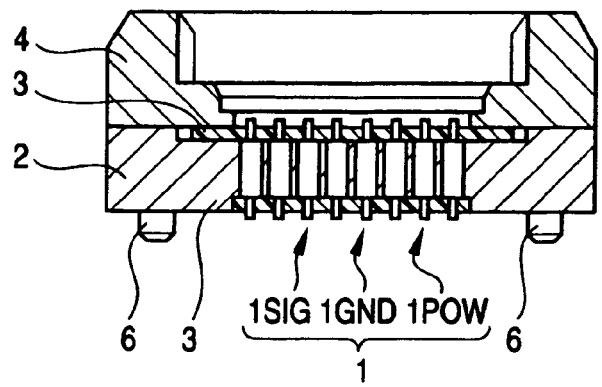
FIG. 1A is a section view of an inspection unit according to a first embodiment of the invention.

As shown in FIG. 1, an IC socket according to a first embodiment of the invention comprises a metal block 2 formed with through holes 21. In the through holes 21, there are respectively provided: a contact probe 1SIG for RF signals which serves as a core conductor of a coaxial structure and has a relatively small outer diameter; a contact probe 1POW for power supply which has a larger outer diameter than the contact probe 1SIG; and a contact probe 1GND for grounding which has a larger outer diameter than the contact probe 1SIG.

Further, a retainer 3 for retaining the contact probes 1SIG, 1POW, 1GND is provided on at least one face of the metal block 2 in such a manner that these probes do not escape from the metal block 2, while only plungers 11 of the contact probes 1SIG, 1POW, 1GND are projected the in this embodiment, a structure including the through holes 21 and the retainer 3 is common with respect to all the contact probes 1SIG, 1POW, 1GND.

Specifically, all the through holes 21 formed in the metal block 2 through which the contact probes 1SIG, 1POW, 1GND are adapted to pass have the same diameter, and the retainer 3 is formed in a two step structure having a part (a first recessed part 33) for fixing the contact probes having the larger outer diameters (the contact probes 1POW and 1GND), and a part (a second recessed part 34) for fixing the contact probe having the smaller outer diameter (the contact probe 1SIG). In this manner, the through holes 21 provided in the metal block 2 and the retainer 3 are commonly used by all the contact probes 1SIG, 1POW, 1GND.

In this embodiment, the contact probes 1 (1SIG, 1POW, 1GND) are fixed to the metal block 2 by the retainer 3, and a device guide plate 4 is mounted thereon. In this IC socket, the contact probes 1SIG, 1POW, 1GND are connected to an inspection board which is not shown, by positioning a plurality of positioning pins 6 provided on the metal block 2 in alignment with determined positions of the inspection board, and the IC or the like to be inspected is inserted into a recess of the device guide plate 4 at the top, whereby electrode terminals of the IC or the like are connected to the contact probes 1 to execute the inspection.

Figure 2:
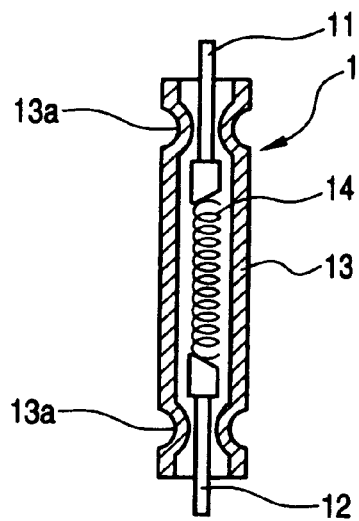
FIG. 2 is a section view of one of the contact probes shown in FIG. 1B.

As shown in FIG. 2, the contact probe 1 has such a structure that a spring 14 and one ends of the plungers 11, 12 are contained in a metal pipe 13, and the plungers 11, 12 are held so as not to escape from the metal pipe 13 by neck portions 13a formed in the metal pipe 13, and to be urged outwardly by the spring 14. When the tip ends of the plungers 11, 12 are pressed, the spring 14 will be contracted so that the tip ends may be pushed into the metal pipe 13, and while no force is applied, the tip ends of the plungers 11, 12 are projected from the metal pipe 13 about 1 mm, for example. Although contact probes in this embodiment provide the plungers 11, 12 at each end thereof, it would be sufficient that the plunger 11 is provided on at least one side of the contact probe which comes into contact with the device to be inspected.

The metal pipe 13 has a length of about a few millimeters and may be formed of nickel silver (copper, nickel, zinc alloy) for example. As the plungers 11, 12, a wire member having a diameter of about 0.1 mm and formed of SK material or beryllium copper may be used. The spring 14 may be formed of a piano wire or the like.

Although the contact probes 1 have substantially the same structure irrespective of their uses, namely, for signals, for power supply and for grounding, the contact probe 1SIG for the RF signals must be formed in a coaxial structure in combination with an inner wall of the through hole 21 of the metal block 2 which serves as an outer conductor, as described below. For this purpose, an outer diameter of the contact probe 1SIG is set so as to obtain predetermined impedance between the contact probe 1 (the core conductor) and the inner wall of the through hole 21 (the outer conductor).

For example, in case of an inspection unit having a pitch of 0.5 mm (the contact probes are provided in a matrix manner with a pitch of 0.5 mm), the outer diameter d1 of the metal pipe 13 is set to be 0.2 mm, and in this case, the outer diameter p1 of the plungers 11, 12 is set to be 0.14 mm. On the other hand, in a case of the contact probes 1POW, 1GND for power supply and for grounding, both the outer diameters d2, d3 of the metal pipes 13 are set to be 0.3 mm, and both the outer diameters p2, p3 of the plungers 11, 12 are set to be 0.15 mm. On this occasion, the inner diameter D of all the through holes 21 is set to be 0.43 mm. Further, a length L1 of the metal pipe 13 of the contact probe 1SIG for signals is 4.4 mm for example, and formed longer than lengths L2, L3 of the metal pipes 13 of the contact probes 1POW, 1GND for power supply and for grounding which is 4 mm. This depends on the structure of the retainer 3 which will be described below.

The metal block 2 is intended to hold the contact probe 1SIG, the contact probe 1POW, and so on, which are brought into contact with the electrode terminals of the IC or module which is the device to be inspected, and formed of metallic material such as aluminum or brass for example. It is possible to form the coaxial structure including the inner wall of the through hole 21 as the outer conductor and the contact probe 1SIG as the core conductor. The inner diameter D of the through hole 21 and the outer diameter d1 of the contact probe 1SIG are set so as to obtain the coaxial structure having the predetermined impedance. In other words, it is possible to adjust the impedance to a characteristic impedance Zo, by setting the diameters so as to satisfy the following Equation (1).

$$Zo = \frac{60}{\sqrt{\varepsilon_r}} \log_e \frac{D}{d} \quad (1)$$

where, d is the outer diameter of the core conductor, D is the inner diameter of the outer conductor, and $\varepsilon_r$ is a dielectric constant of the dielectric substance between them.

In order to decrease the dielectric constant as the pitch of the electrode terminals becomes smaller, a gap is formed between the contact probe 1SIG and the inner wall of the through hole 21. However, since such relation of impedance is not required in the contact probe 1POW the contact probe 1POW is covered with an insulating tube 16 having such a thickness that the contact probe 1POW may not make a short circuit with the metal block 2. Although not shown, the contact probe 1GND is also covered with a ground tube 17 made of phosphor bronze, for the purpose of improving contact performance with the inner wall of the through hole 21.

Thickness and dimension of the metal block 2 may vary depending on the type of inspection unit into which the metal block is incorporated, for example, an IC socket which simply interconnects the IC and the inspection board provided with wirings, or an inspecting tool connected to the inspection board to which a coaxial cable or the like is connected. However, in general cases, the metal block 2 is formed having a thickness of about 3 to 8 mm, and an area of 30 to 50 mm square.

Figure 1B:
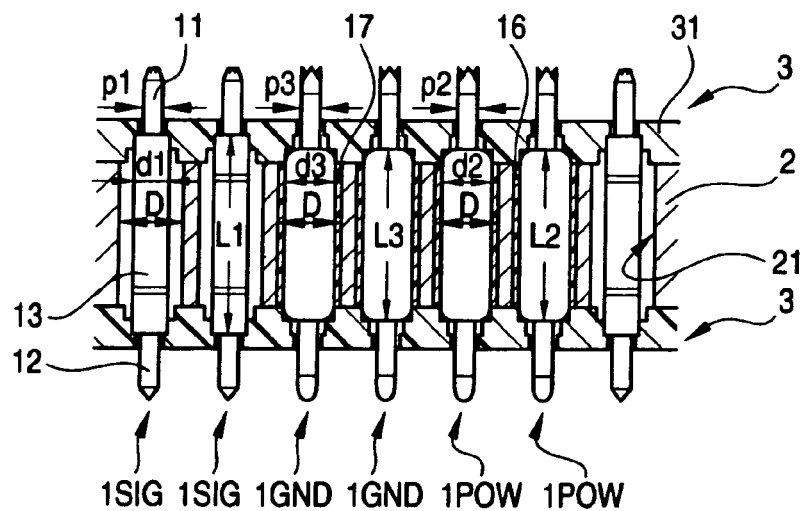
FIG. 1B is an enlarged section view showing contact probes in the inspection unit of FIG. 1A.
Figure 1C:
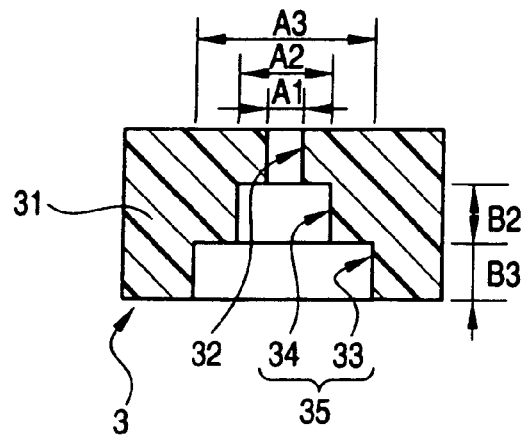
FIG. 1C is an enlarged section view of an insulative plate in the inspection unit of FIG. 1A.

In this embodiment, the retainer 3 includes insulating boards 31 which are formed on both faces of the metal block 2 and provided with through holes 32 and recessed parts 35. The insulating board 31 is in a form of a plate having a thickness of about 0.6 mm and formed of resin for example. The insulating board 31 is provided with the through holes 32 through which the plungers 11, 12 are adapted to pass in alignment with the positions of the contact probes 1, and the recessed parts 35 which are formed concentrically with the through holes 32, as shown in FIG. 1C. Each of the recessed parts 35 includes the first recessed part 33 and the second recessed part 34 which are defined by forming stepped parts.

The insulating board 31 formed of resin such as polyether imide (PEI) is preferably employed, because the recessed parts 35 and the through holes 32 can be easily formed with precise dimensions by resin molding, even in a case where a number of the contact probes 1 are arranged in parallel at a narrow pitch. Moreover, the above described resin has a large mechanical strength, and in a case where the insulating board is formed with the above described thickness, the contact probes of several hundreds or more can be stably fixed, without occurring deflection. However, any other material can be also employed, provided that the material is electrically insulating and has mechanical strength, even though thin.

The insulating boards 31 provided on the opposite faces of the metal block 2 need not have necessarily the same thickness, but can be freely selected. In case where the plungers 11 and 12 are projected from both sides of the contact probe 1, the recessed parts 35 having substantially the same shape are formed. On the other hand, in a case where the same inspection board can be used on the side opposite to the side in contact with the electrode terminals of the device to be inspected, it is possible to fix one end part of the contact probe to the inspection board by soldering or so, and it is not necessary to form the plunger at the one end of the contact probe 1. It would be sufficient to provide the retainer of this type only on the one face of the metal block 2.

The through hole 32 is formed having such a diameter that the plungers 11, 12 of the contact probe 1 are adapted to pass through. In case where the diameters of the plungers 11, 12 are different depending on the contact probes 1, the through hole 32 is formed having such a diameter that the plunger 11 or 12 having the largest diameter can pass through. In this embodiment, the contact probes 1POW, 1GND have the largest diameter of 0.15 mm, and a diameter A1 of the through hole 32 is formed to be larger than 0.15 mm, that is, about 0.17 mm, for example. In this case, even though the board 31 gets in touch with the plunger 11 or 12, it would not be a trouble, provided that they can move freely, since the board is the insulating board.

The first recessed part 33 is formed having such a diameter that the larger contact probe, that is, the contact probes 1POW, 1GND can be inserted. Specifically, in this embodiment, the first recessed part 33 is formed having a diameter A3 of about 0.33 mm, and a depth B3 of about 0.2 mm. The second recessed part 34 is formed concentrically with the through hole 32, having such a diameter that the smaller contact probe, that is, the contact probe 1SIG for signals can be inserted, but the larger contact probe, that is, the contact probes 1POW, 1GND cannot be inserted. For example, a diameter A2 is about 0.23 mm, and a depth B2 is about 0.2 mm.

In the above described structure, the contact probe 1SIG, which is smaller in diameter than that of the contact probes 1POW and 1GND, passes through the first recessed part 33, and cannot pass through the second recessed part 34 but stays there. Besides, the contact probe 1SIG for signals is fixed in the second recessed part 34 keeping concentricity therewith, because the diameter of the second recessed part 34 is not so larger than that of the contact probe 1SIG. On the other hand, the contact probes 1POW, 1GND can enter into the first recessed part 33, but cannot enter into the second recessed part 34, and therefore, will be fixed in the first recessed part 33. Looking from the surface of the metal block 2, the first recessed part 33 is shallow while the second recessed part 34 is deep, and insertion lengths are different depending on the contact probes 1. However, the contact probe 1SIG having the smaller diameter is formed longer as described above, and all the contact probes can be fixed at the same time by the insulating board 31 in a shape of a plate, as shown in FIG. 1B.

Next, a second embodiment of the invention will be described. Components similar to those in the first embodiment will be designated by the same reference numerals and repetitive explanations for those will be omitted.

Figure 3A:
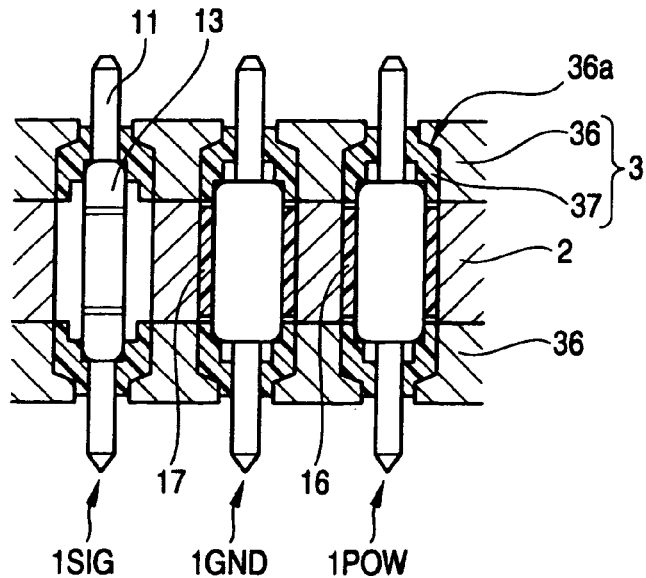
FIG. 3A is an enlarged section view of an inspection unit according to a second embodiment of the invention.

As shown in FIG. 3A, instead of employing the insulating board 31, the retainer 3 includes a metal plate 36 having a thickness of about 1 mm which is formed of aluminum or brass for example, and an insulating spacer 37 which is inserted into a recessed part 36a formed in the metal plate 36. The recessed part 36a may be formed in such a shape as corresponding to an outer shape of the insulating spacer 37, so that the insulating spacer 37 can be inserted into and fitted with the recessed part 36a with almost no clearance. The insulating spacer 37 is formed of polyether imide (PEI) for example.

Figure 3B:
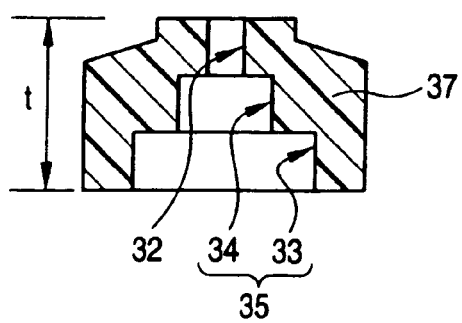
FIG. 3B is an enlarged section view of an insulative spacer in the inspection unit of FIG. 3A.
Figure 4A:
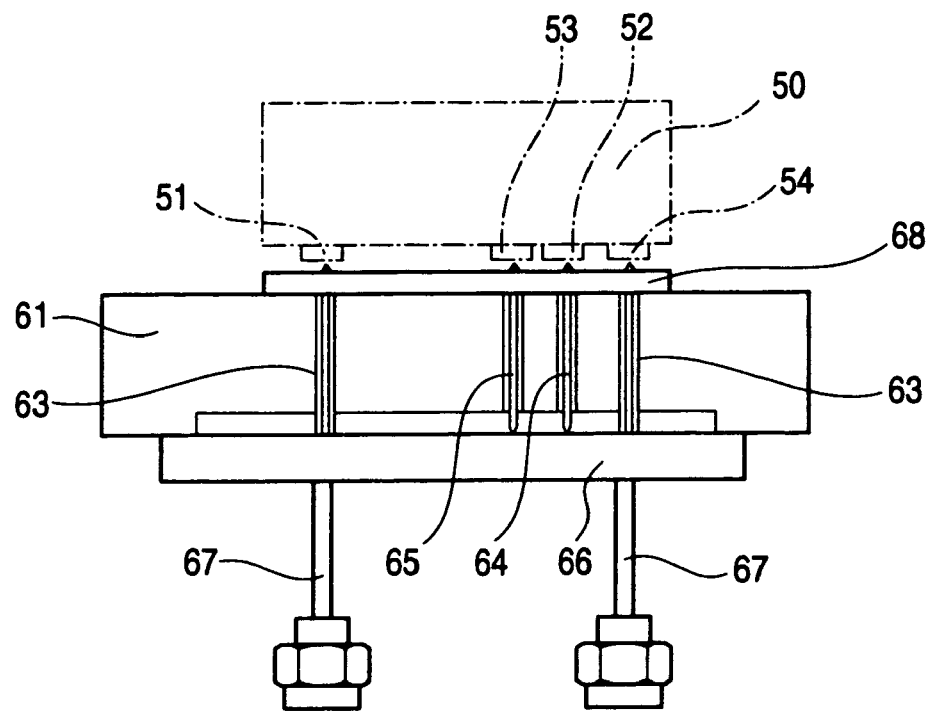
FIG. 4A is a schematic view of a conventional inspection unit.
Figure 4B:
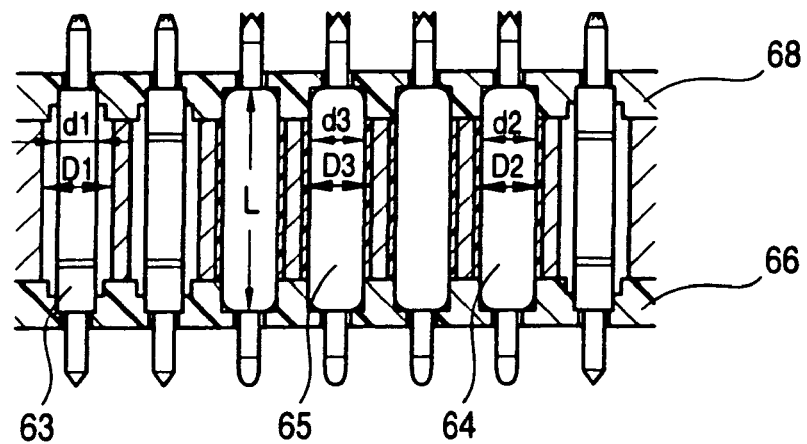
FIG. 4B is an enlarged section view showing contact probes in the inspection unit of FIG. 4A.

As shown in FIG. 3B, the insulating spacer 37 has the outer shape corresponding to the recessed part 36a of the metal plate 36, and at the same time, has a recessed part 35 which has the same structure as the above described structure as shown in FIG. 1C. A thickness t of the insulating spacer 37 is about 0.6 mm for example. It is possible to fix all the contact probes 1 in the same manner, by forming the through holes 32, the first recessed parts 33, and the second recessed parts 34 with the same sizes as in the embodiment as shown in FIG. 1C.

According to this structure, by forming the insulating spacer by molding or so, it is possible to easily form the recessed parts having the stepped parts, and mass production can be very easily achieved. Besides, because peripheries of the contact probes are respectively covered with the metal plates 36, noises from outside can be completely shut out, and extremely stabilized inspection can be conducted. A method of pouring the insulating spacer into the metal plate by integral molding may be employed.

In the above described embodiments, all examples shown have the retainer part for fixing the contact probe in the recessed part with the two-step structure. However, instead of the recessed part having the stepped parts, any other shape such as a tapered configuration can be also employed, provided that the contact probes having different diameters can be fixed at determined positions.

According to the above embodiments, provided that the metal block the retainer, and the contact probes have been manufactured in advance, the inspection unit can be easily produced in a very short time immediately after determination of arrangement of the electrode terminals of the device to be inspected, only by setting the contact probe for signals, the contact probe for power supply, and the contact probe for grounding to the through holes of the metal block, according to thus determined arrangement.

Specifically, because the arrangement of the terminals such as the grounding terminal may be sometimes changed in the recent module or IC, in a case where a desired performance is not obtained, as described above, the through holes are formed at substantially same positions in the metal block. For this purpose, the diameters of the through holes are made common irrespective of the types of the electrode terminals, and the retainer for the contact probes are also made common. Consequently, the inspection unit can be prepared by simply setting the contact probe for signals, the contact probe for power supply, and the contact probe for grounding which have been already formed, in the through holes at the determined positions, according to the arrangement of the electrode terminals in the device to be inspected, and by adjusting a part of the circuit of the inspection board.

As the results, it is possible to easily produce an inspection unit for an IC socket or the like in a very short time and at a low cost, and it is possible to immediately provide the inspection unit for the high frequency/high speed device in the course of development, as well as an inspection unit to be used after completion of development. Besides, the through holes formed in the metal block and the retainer are made common for all the contact probes, and accordingly, production itself of these metal block and retainer has become very easy, whereby, reduction of the cost can be achieved.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An inspection unit, comprising:
   a conductive member, having a first face adapted to be mounted on a board on which an inspection circuit is arranged and a second face adapted to be opposed to a device to be inspected, the conductive member being formed with a plurality of first through holes having a first common diameter and communicating the first face with the second face;
   a first contact probe, comprising a first tubular body having a second diameter which is smaller than the first diameter, and a first plunger retractably projected from one end of the first tubular body;
   a second contact probe, comprising a second tubular body having a third diameter which is smaller than the second diameter, and a second plunger retractably projected from one end of the second tubular body; and a retainer, formed with a plurality of second through holes having a common shape, and provided on at least the second face of the conductive member so as to communicate the first through holes with the second through holes, wherein each of the second through holes is adapted to selectively retain one of the first contact probe and the second contact probe in the conductive member while only the first plunger and the second plunger are projected from one end of the second through holes.

2. The inspection unit as set forth in claim 1, wherein the first contact probe is adapted to transmit a non-RF signal and the second contact probe is adapted to transmit an RF signal.

3. The inspection unit as set forth in claim 1, wherein each of the second through holes has a first part having a fourth diameter which is smaller than the second diameter and larger than the third diameter, and has a second part having a fifth diameter which is smaller than the third diameter and larger than a diameter of each of the first plunger and the second plunger.

4. The inspection unit as set forth in claim 3, wherein the retainer comprises an insulative plate member formed with the second through holes.

5. The inspection unit as set forth in claim 3, wherein the retainer comprises a conductive plate member having third through holes having a common shape and insulative spacers each of which is formed with one of the second through holes and fitted into one of the third through holes.

6. The inspection unit as set forth in claim 3, wherein an inner diameter of each of the second through hole is varied stepwise so as to have at least the fourth diameter and the fifth diameter.

7. The inspection unit as set forth in claim 3, wherein an inner diameter of each of the second through hole is varied continuously so as to have at least the fourth diameter and the fifth diameter.

8. The inspection unit as set forth in claim 3, wherein the second tubular body is longer than the first tubular body.

* * * * *